(12) United States Patent
Binboga

(10) Patent No.: US 9,177,616 B2
(45) Date of Patent: Nov. 3, 2015

(54) SUPPLY POWER DEPENDENT CONTROLLABLE WRITE THROUGHPUT FOR MEMORY APPLICATIONS

(71) Applicant: Spansion LLC, Sunnyvale, CA (US)

(72) Inventor: Evrim Binboga, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 410 days.

(21) Appl. No.: 13/644,895

(22) Filed: Oct. 4, 2012

(65) Prior Publication Data

US 2014/0098624 A1   Apr. 10, 2014

(51) Int. Cl.
*G11C 5/14*   (2006.01)

(52) U.S. Cl.
CPC .............. *G11C 5/147* (2013.01); *G11C 5/143* (2013.01)

(58) Field of Classification Search
CPC ............ G11C 5/14; G11C 5/143; G11C 7/20; G11C 5/145; G11C 5/147; G11C 16/30; G11C 8/12
USPC .......... 365/226, 191, 185.11, 189.09, 189.11, 365/185.23, 229
See application file for complete search history.

(56) References Cited

U.S. PATENT DOCUMENTS

| | | |
|---|---|---|
| 2004/0095834 A1 | 5/2004 | Chevallier |
| 2005/0237823 A1 | 10/2005 | Aitken et al. |
| 2007/0109900 A1* | 5/2007 | Sakurai et al. ................. 365/226 |
| 2009/0161451 A1* | 6/2009 | Kim .............................. 365/191 |
| 2010/0257379 A1 | 10/2010 | Wang et al. |
| 2010/0332923 A1 | 12/2010 | D'Abreu et al. |

FOREIGN PATENT DOCUMENTS

KR   10-2001-0100815 A   11/2001

OTHER PUBLICATIONS

International Search Report and Written Opinion of the International Searching Authority mailed Jan. 16, 2014 for International Application No. PCT/US2013/063088.

* cited by examiner

*Primary Examiner* — Thong Q Le

(57) ABSTRACT

Devices and methods that allow dynamic management of throughput in a memory device based on a power supply voltage are provided. According to various embodiments, the power supply level can be monitored. Based on the result of the monitoring, an appropriate throughput can be determined. Once the appropriate throughput is determined, an appropriate control signal based on the determined throughput can be generated. The control signal can be configured to cause a bitline driver circuit in a memory array to activate a number of bitlines consistent with the determined throughput.

22 Claims, 5 Drawing Sheets

SUPPLY POWER DEPENDENT CONTROLLABLE WRITE THROUGHPUT FOR MEMORY APPLICATIONS

BACKGROUND OF THE INVENTION

1. Field of the Invention

The present invention generally relates to semiconductor memory and specifically to systems and methods that allow for varied write throughput in semiconductor memory applications.

2. Related Art

Flash memory is a non-volatile memory composed of a number of individual memory cells that can each hold a value (i.e., 1 or 0) depending on what has been written to them previously. Like most re-programmable memory, Flash memory can be read, programmed, or erased. To program and erase Flash memory requires the application of a certain amount of current (often provided by a charge pump) to the cell or cells that are to be programmed or erased. The number of cells that can be written at a time is called "write throughput."

The amount of write throughput that a memory device can accommodate depends on a number of factors including the size of the memory array and its structure, area allocated for peripheral circuitry (e.g., charge pumps, regulators, drivers, etc.), operating temperature, and power supply voltage, to name a few. One of the largest factors affecting write throughput, however, is the current capacity of the charge pump, which is directly related to, amongst other things, the voltage level of the power supply.

Memory devices (as with most semiconductor devices) are typically designed to operate using a range of supply voltages. For instance, one common supply voltage range for such devices is 2.6 V to 3.6 V. In order to guarantee a particular throughput for a memory device, the memory device must be designed to achieve that throughput even in the worst case scenario—i.e., when a supply voltage of 2.6 V is provided. However, in many cases, the memory device may be used in an application that provides greater than the minimum supply voltage. It would be desirable in these scenarios to allow the memory device to take advantage of the increased supply voltage (and corresponding increase in charge pump current) to increase the throughput of the device.

Thus, what is needed is a memory device that allows throughput to vary with the power supply voltage.

BRIEF SUMMARY OF THE INVENTION

Embodiments of the invention include systems and methods of managing write throughput in a memory device. According to some embodiments, a method is provided where the power supply level is monitored. An appropriate throughput can then be determined based on the monitored power supply level. A control signal for controlling a number of memory drivers can then be generated based on the determined throughput. The control signal, according to embodiments, can cause the memory driver to activate a portion of a memory array that is consistent with the determined throughput. According to some embodiments, the method may also detect change in the power supply level and, in response, determine an adjusted (e.g., increased or decreased) throughput to be appropriate. The control signal can then be adjusted to deactivate a portion of the memory array or to activate previously inactive memory array portions depending on the adjusted throughput when the implemented operational sequences allows this update to take place.

According to some embodiments, a memory device is provided. The memory device includes a memory array, a controller, and a driver circuit. The memory may include a plurality of memory cells and/or bitlines. The controller can be configured to monitor a power supply level, determine an appropriate throughput based on the power supply level, and to generate a control signal based on the determined throughput. The driver circuit may be configured to selectively drive portions of the memory array based on the received control signal. The memory device may also include a power supply level detector configured to sense the power supply level and output an indication of the power supply level to the controller.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

Figure 1:
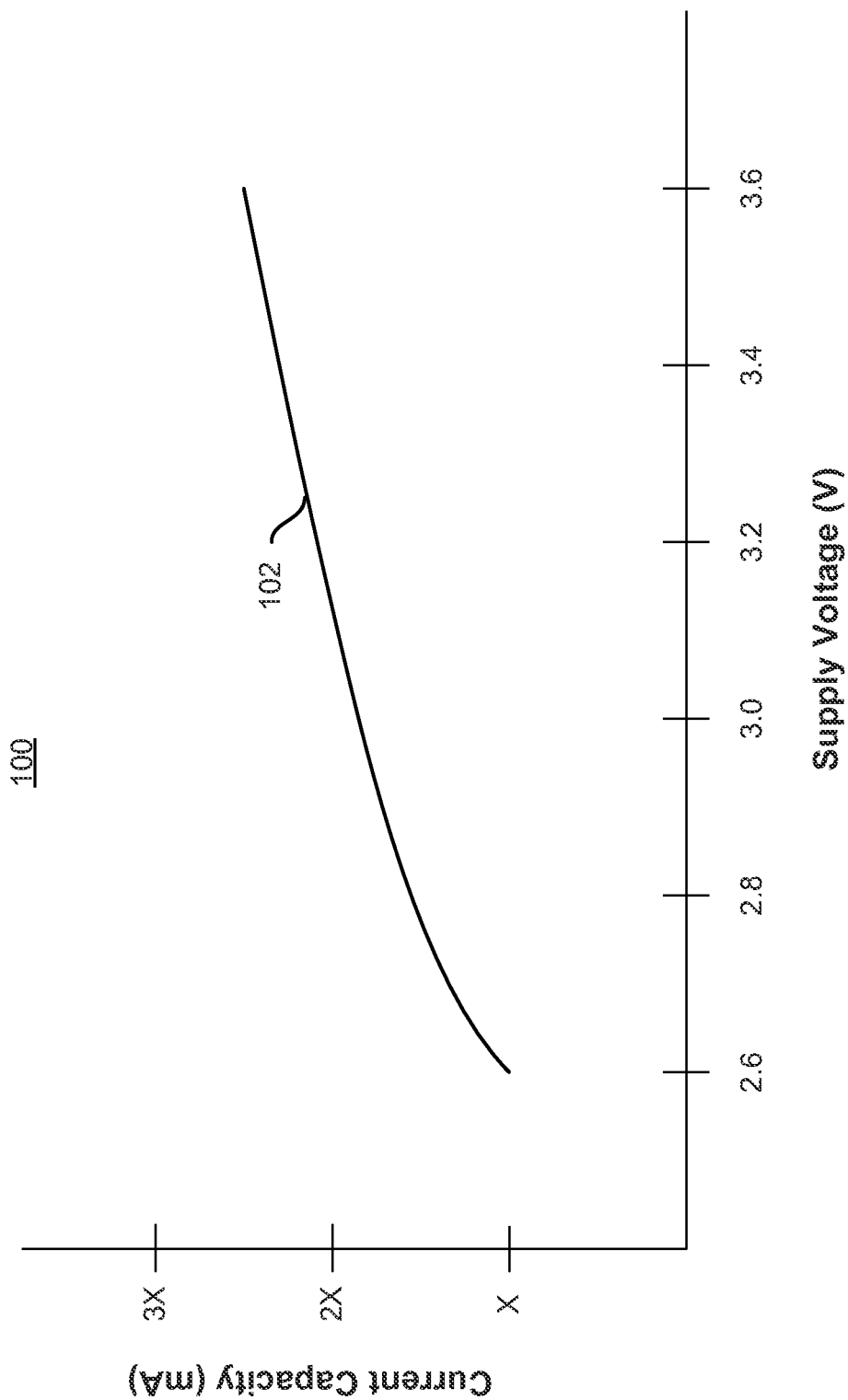
FIG. 1 is an exemplary graph of the current capacity of a charge pump at various supply voltages.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

The following detailed description of the present invention refers to the accompanying drawings that illustrate exemplary embodiments consistent with this invention. Other embodiments are possible, and modifications can be made to the embodiments within the spirit and scope of the invention. Therefore, the detailed description is not meant to limit the invention. Rather, the scope of the invention is defined by the appended claims.

Various memory technologies are implemented with a memory core that comprises a number of individual memory cells each of which can store a value (e.g., 1 or 0). Different memory technologies have comparative advantages. Some, for instance, have a comparatively higher program speed and erase speed, but has a competitively lower read speed. Others, have a much higher read speed, but comparatively low program and erase speeds. One reason for a memory technology to have slower program and erase speeds is that it can require much more current per cell to effect a program or erase operation in some technologies. Given that, in most applications, there is only a finite amount of current available, in those technologies that require greater current per cell to effect program and erase operations, many fewer memory cells can be written at a time. That is, these technologies have less write throughput. However, write throughput can be increased in these memory devices (and others) by allowing them to capitalize on additional current when it is available so that more cells may be programmed or erased at a time.

FIG. 1 depicts a curve 102 that illustrates an exemplary current capacity of a charge pump in a memory device versus the supply voltage (in volts V). The numbers used are purely for example purposes and not tied to any particular embodiment. As can be seen in the graph 100, the current capacity mA varies greatly with the supply voltage thereby resulting in a large range of current capacity for a given range of supply voltage. For instance, in the worst case scenario depicted on the graph (an input voltage of 2.6 V), the current capacity is X mA, whereas in the best case scenario depicted (an input voltage of 3.6 V), the current capacity of the charge pump is about 2.5X mA. Accordingly, as can be seen by graph 100, the current capacity of the charge pump increases with the supply voltage.

In order to ensure that a device always functions in specified operating condition, the device is normally designed to operate under the "worst case scenario." For instance, in the range depicted in FIG. 1, a memory device might be designed so that it is operational with a supply voltage of 2.6 V. A maximum available supply current of X mA might, therefore, be assumed during the design of the memory device. It can be desirable, however, to allow a user operating the device under "better" conditions (e.g., higher supply voltage) to take advantage of the increased current capacity and, accordingly, the increased throughput ability.

Figure 2:
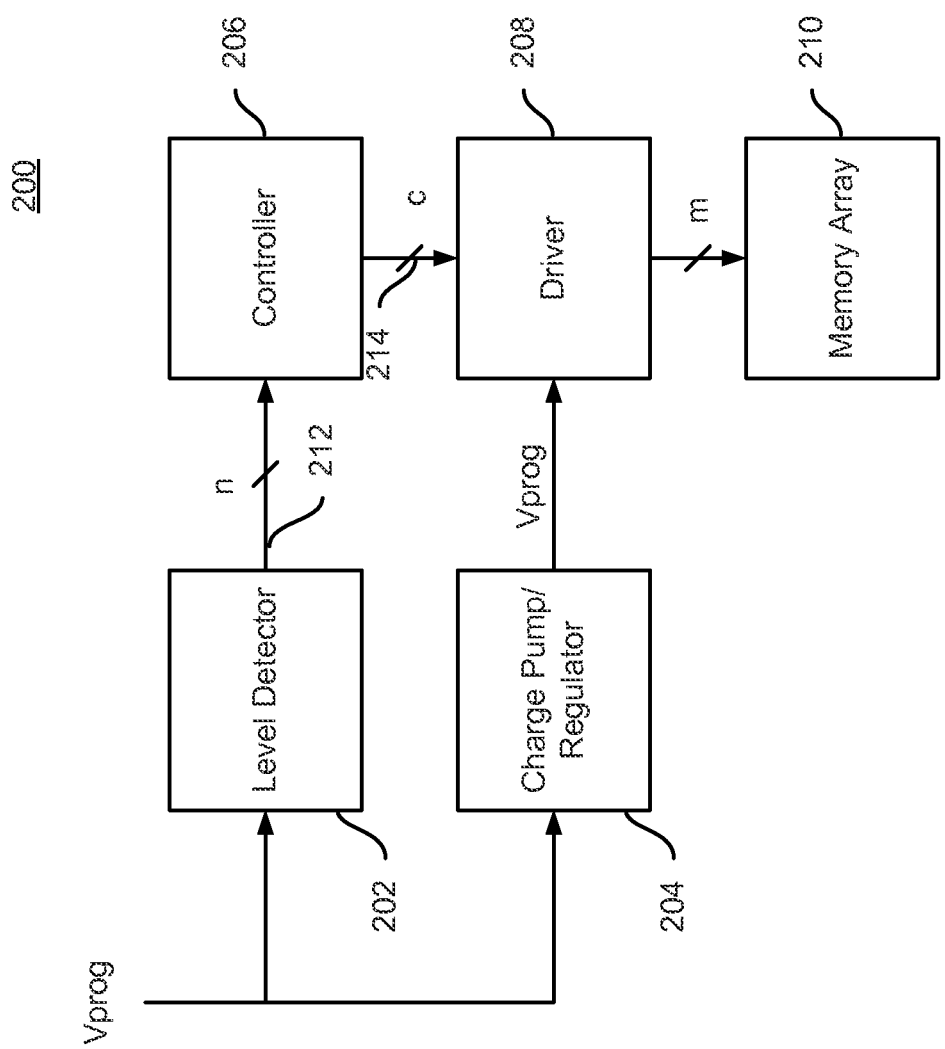
FIG. 2 is a functional block diagram depicting a memory device according to various embodiments of the invention.

FIG. 2 depicts a memory device 200 that allows throughput to vary with supply voltage according to embodiments of the present invention. The memory device 200 may comprise a level detector 202, charge pump and/or regulator 204, a controller 206, a driver 208, and a memory array 210. The level detector can measure the power supply Vdd and determine a current power level, which it can then output to the controller 206.

According to some embodiments, the level detector 202 comprises an analog-to-digital converter (ADC) and outputs a digitized value of the detected level. However, the level detector may also be configured to determine whether the voltage level falls into one of a plurality of different levels or "bins." For instance, continuing with the example earlier, assume that the memory device 200 is designed to operate in the range of 2.6 V to 3.6 V. The detector 202 may be configured to determine whether the supply voltage falls into one of, for instance, 4 bins. One possible division of the level bins might be as follows:

| Level | Voltage |
|---|---|
| 0 | 2.60-2.85 |
| 1 | 2.86-3.10 |
| 2 | 3.11-3.35 |
| 3 | 3.36-3.60 |

The level detector 202 can be configured to output an indication of the voltage level of the supply voltage to the controller on bus 212. The size of bus 212 may vary according to the various embodiments. For instance, if the detector 202 is implemented as an ADC, then bus 212 may need to be a large number of bits depending on the precision of the ADC. However, if the level detector 202 is implemented to determine which of several level bins the supply voltage is, as discussed above, then bus 212 need only be the number of bits required to express the number of levels. For instance, in the above example with four levels, the bus 212 would only need to have two bit lines in order to express the four possible levels. A person having ordinary skill in the art can readily envision other implementations to achieve the same functionality based on the disclosure herein without departing from the scope of the inventions.

Controller 206 receives the level information from the level detector 202 and uses the level information to determine an appropriate throughput. According to some embodiments, the controller 206 may use a look-up table to determine the appropriate throughput. The look-up table may be programmed at the time of manufacture and may comprise a read-only memory (ROM) such as one-time programmable (OTP) ROM, PROM, EPROM, EEPROM, or the like. Additionally, according to some embodiments, the look-up table may be programmed by the user or re-programmable by the user and may be stored on a re-programmable memory such as a flash memory.

In some embodiments, the controller may also use the level information from the level detector 202, in combination with other pre-determined constants (e.g., maximum current, number of bitlines, etc.) to calculate the appropriate throughput instead of relying on a look-up table. Based on the determined throughput, the controller 206 generates a control signal and sends the control, which is then communicated to driver 208. Charge pump/regulator 204 can be used to provide driving current to the driver 208 for write operations in the memory array 210. Again, the case of a lookup table is provided by example and not limitation to the scope of the invention.

Driver circuit 208 provides driving current to the bitlines in the memory array 210 based on the input received on bus 214 from the controller 206. Driver 208 may be implemented similarly to the driver circuit 300 depicted in FIG. 3 according to various embodiments.

Figure 3:
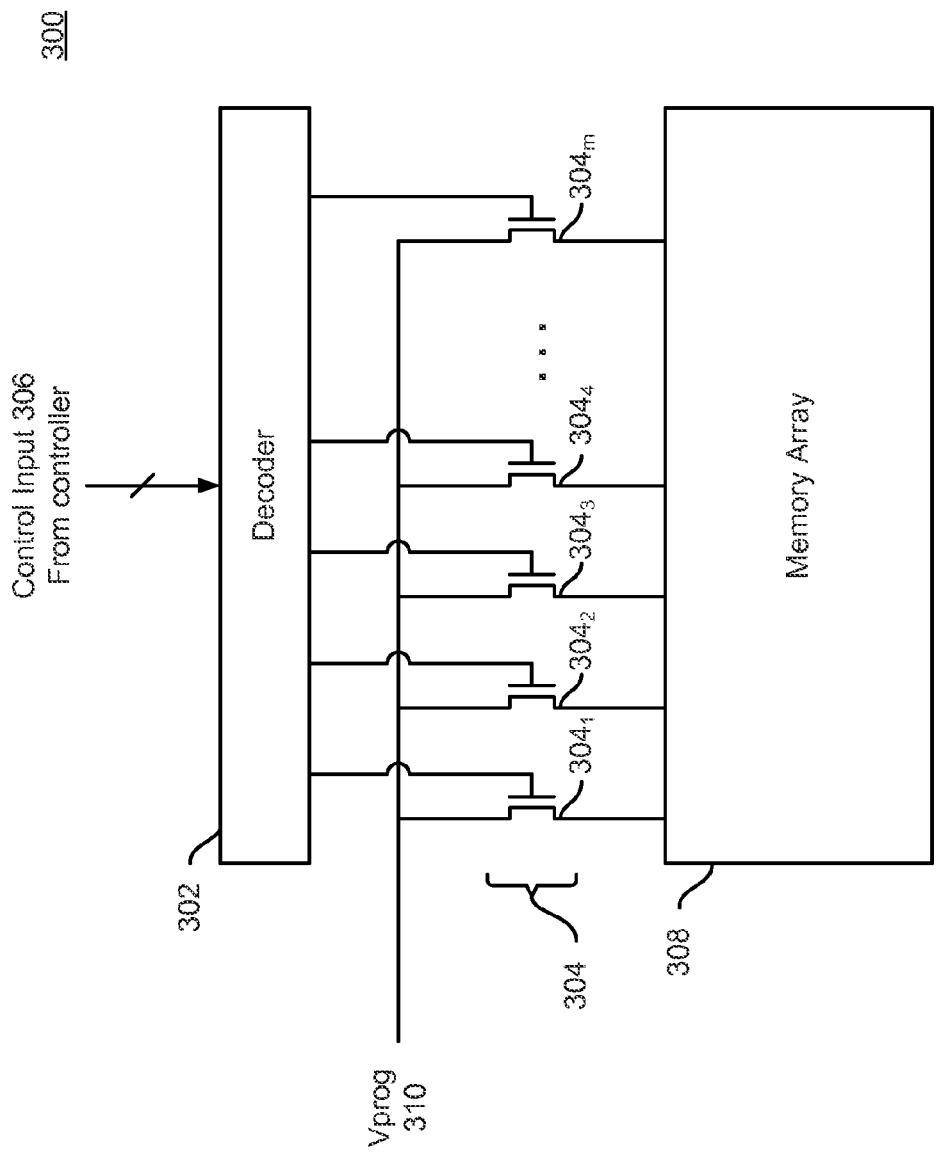
FIG. 3 is a functional block diagram depicting a memory driver according to various embodiments of the invention.

As shown in FIG. 3, driver circuit 300 can include a decoder 302, a bank of m transistors $304_1$, $304_2$, $304_3$, $304_4$, . . . , $304_m$ (collectively referred to as transistors 304), which are connected between Vprog (i.e., power from the charge pump/regulator 204 shown in FIG. 2) and the individual bitlines of the memory array 308. As depicted in FIG. 3, the decoder 302 receives control input 306 from the controller 206 on bus 214. The decoder can then decode the input to cause an appropriate number of the transistors in the transistor bank 304 to turn on. According to some embodiments, the decoder may be omitted and the output from the controller may be directly connected to the various gate terminals in the transistor bank 304.

When the output from the decoder causes a transistor in the transistor bank 304 to turn on, it allows power from the Vprog 310 to power the various bitlines in the memory array 308. The bitlines can then be used for memory operations.

Figure 4:
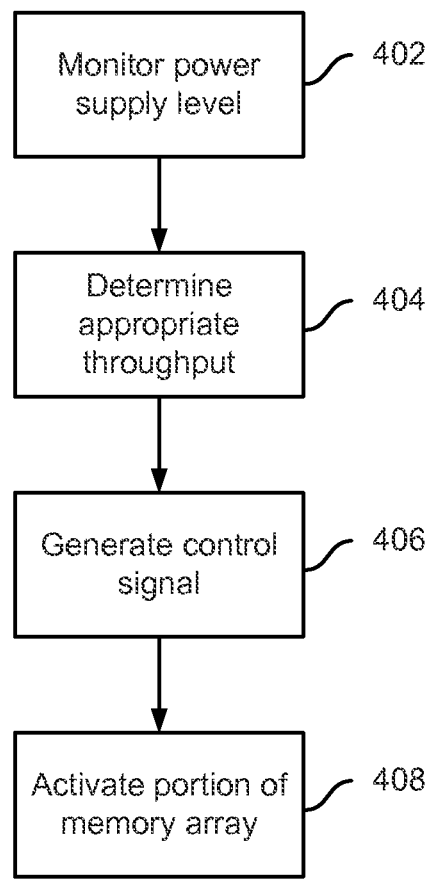
FIG. 4 is a flowchart depicting a method of setting throughput in a memory device according to various embodiments of the invention.

FIG. 4 depicts a method 400 for varying the throughput of a memory device according to various embodiments of the invention. As shown in FIG. 4, the method 400 begins by monitoring the power supply level at step 402. As discussed above, the power supply level can be monitored by an ADC. The ADC outputs a digital representation of the power level to the controller 206, or by determining which of several "bins" the power supply level falls into, transmits an appropriate indication of the "bin" to the controller 206.

At step 404, the controller can determine the appropriate throughput for the memory device based on the power supply level it has received. According to some embodiments, the controller may do this by accessing a look-up-table and to find the appropriate throughput based on the input power level. Alternatively, according to some embodiments, the controller may determine the appropriate throughput by calculating it.

At step 406, the controller can generate an appropriate control signal according to various embodiments of the invention. The control signal may be encoded or not. At step 408, the portion of the memory array indicated by the control signal can be activated. For instance, the portion of the memory array can be activated by turning appropriate transistors connecting the power supply to the various bit lines to the power supply ON. The control signal can cause a number of the transistors to turn OFF, according to some embodiments.

Figure 5:
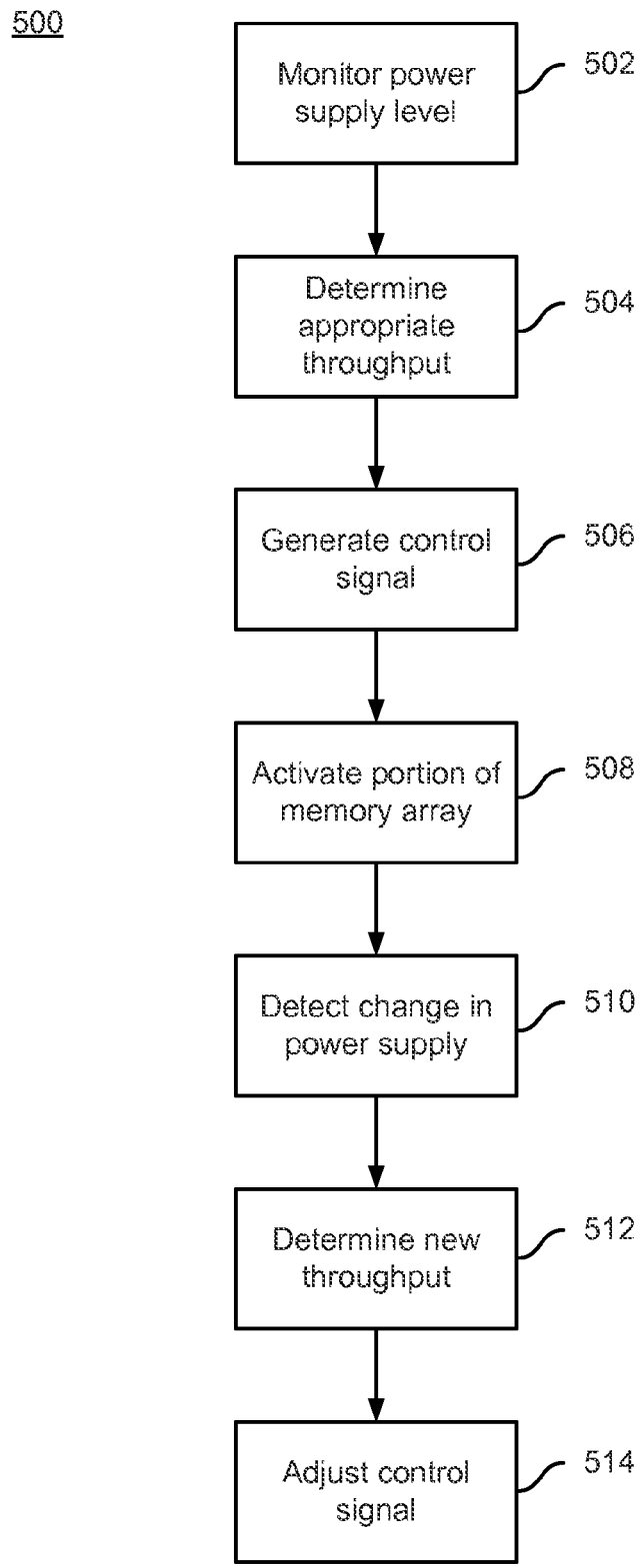
FIG. 5 is a flowchart depicting a method of setting throughput in a memory device according to various embodiments of the invention.

According to some embodiments of the present invention, the memory device may change (i.e., increase or decrease) the throughput when the supply voltage changes. An example of a method of doing so is depicted in FIG. 5. As shown in FIG. 5, the method 500 begins by monitoring the power supply level at step 502. As discussed above, the power supply level can be monitored by an ADC. The ADC outputs a digital representation of the power level to the controller 206, or by determining which of several "bins" the power supply level falls into, transmits an appropriate indication of the "bin" to the controller 206.

At step 504, the controller can determine the appropriate throughput for the memory device based on the power supply level it has received. According to some embodiments, the controller may do this by accessing a look-up-table and to find the appropriate throughput based on the input power level. Alternatively, according to some embodiments, the controller may determine the appropriate throughput by calculating it.

At step 506, the controller can generate an appropriate control signal according to various embodiments of the invention. The control signal may be encoded or not. At step 508, the portion of the memory array indicated by the control signal can be activated. For instance, the portion of the memory array can be activated by turning appropriate transistors connecting the power supply to the various bit lines to the power supply ON. The control signal may also cause appropriate transistors OFF according to some embodiments.

At step 510, the memory device may detect a change in the supply voltage and the new voltage supply level (or bin) will be transmitted to the controller. The controller will then determine whether a new throughput is required. If a new throughput is determined to be required at step 512, then the controller can adjust the control signal at step 514. The new control signal may cause additional transistors to be turned ON/OFF depending on whether more or less throughput is warranted by the change in power supply level.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of managing throughput in a memory device, comprising:
    monitoring a power supply level;
    determining an appropriate memory write throughput based on a number of cells to which the memory device can write at a time at the monitored power supply level;
    generating a control signal based on the determined memory write throughput, wherein the control signal is configured to cause a driver circuit to activate a portion of a memory array consistent with said determined memory write throughput.

2. The method of claim 1, wherein monitoring the power supply level comprises receiving an indication of voltage level value of the power supply from a voltage level detector.

3. The method of claim 1, wherein the driver circuit comprises a plurality of transistors, wherein each of the plurality of transistors is configured to provide power to a corresponding bitline in the memory array.

4. The method of claim 3, wherein each of the plurality of transistors is configured to: provide power to a corresponding bitline when in an ON state; and not provide power to the corresponding bitline when in an OFF state.

5. The method of claim 3, wherein the control signal is configured to toggle the state of a set of the plurality of transistors.

6. The method of claim 5, wherein the set comprises fewer than all of the plurality of transistors.

7. The method of claim 1, wherein the appropriate memory write throughput is determined using a look-up table.

8. The method of claim 7, wherein the look-up table is programmable.

9. The method of claim 1, further comprising:
detecting a reduction in the power supply level;
determining a reduced memory write throughput; and
adjusting the control signal to deactivate a portion of the memory array consistent with the determined reduced memory write throughput.

10. The method of claim 1, further comprising:
detecting an increase in the power supply level;
determining an increased memory write throughput; and
adjusting the control signal to activate an additional portion of the memory array consistent with the determined increased memory write throughput.

11. The method of claim 1, wherein the memory array comprises NOR Flash memory.

12. A memory device, comprising:
a memory array comprising a plurality of memory cells;
a controller configured to:
 monitor a power supply level,
 determine an appropriate memory write throughput based on a number of cells to which the memory device can write at a time at the monitored power supply level, and
 generate a control signal based on the determined memory write throughput; and
a driver circuit configured to selectively drive portions of the memory array based on a received control signal.

13. The device of claim 12, wherein the controller is configured to monitor the power supply level by receiving an indication of the current voltage level of the power supply from a voltage level detector.

14. The device of claim 12, wherein the driver circuit comprises a plurality of transistors, wherein each of the plurality of transistors is configured to provide power to a corresponding bitline in the memory array.

15. The device of claim 14, wherein each of the transistors are configured to provide power to a corresponding bitline when in an ON state; and not provide power to the corresponding bitline when in an OFF state.

16. The device of claim 14, wherein the control signal is configured to toggle the state of a set of the transistors.

17. The device of claim 16, wherein the set comprises fewer than all of the plurality of transistors.

18. The device of claim 12, wherein the appropriate memory write throughput is determined using a look-up table.

19. The device of claim 18, wherein the look-up table is programmable.

20. The device of claim 12, wherein the controller is further configured to:
detect a reduction in the power supply level;
determine a reduced memory write throughput; and
adjust the control signal to deactivate a portion of the memory array consistent with the determined reduced memory write throughput.

21. The device of claim 12, wherein the controller is further configured to:
detect an increase in the power supply level;
determine an increased memory write throughput; and
adjust the control signal to activate an additional portion of the memory array consistent with the determined increased memory write throughput.

22. The device of claim 12, wherein the memory array comprises NOR Flash memory.

* * * * *